(12) United States Patent
Adams et al.

(10) Patent No.: US 7,035,127 B1
(45) Date of Patent: Apr. 25, 2006

(54) METHOD AND SUM ADDRESSED CELL ENCODER FOR ENHANCED COMPARE AND SEARCH TIMING FOR CAM COMPARE

(75) Inventors: Chad Allen Adams, Byron, MN (US); Derick Gardner Behrends, Rochester, MN (US); Todd Alan Christensen, Rochester, MN (US); Peter Thomas Freiburger, Rochester, MN (US); Ryan Charles Kivimagi, Chatfield, MN (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 10/970,522

(22) Filed: Oct. 21, 2004

(51) Int. Cl.
*G11C 15/00* (2006.01)
(52) U.S. Cl. .............. 365/49; 365/189.07; 365/189.11
(58) Field of Classification Search ................. 365/49, 365/189.01, 189.05, 189.07, 189.11
See application file for complete search history.

(56) References Cited

U.S. PATENT DOCUMENTS

| 6,088,763 A | 7/2000 | Silberman et al. | |
|---|---|---|---|
| 6,381,162 B1* | 4/2002 | Peterson | 365/49 |
| 6,385,070 B1* | 5/2002 | Peterson | 365/49 |

* cited by examiner

*Primary Examiner*—Gene N. Auduong
(74) *Attorney, Agent, or Firm*—Joan Pennington

(57) ABSTRACT

A method and a sum addressed content-addressable memory (CAM) compare are provided for implementing an enhanced sum address compare function. True and compliment bit signals applied to the CAM compare are encoded by combining respective ones of the applied true and compliment bit signals. Then the encoded true and compliment bit signals are applied to a critical path dynamic compare circuit. An encoder apparatus encodes true and compliment bit signals that then are applied to the dynamic compare circuit in the critical path.

16 Claims, 2 Drawing Sheets

US 7,035,127 B1

METHOD AND SUM ADDRESSED CELL ENCODER FOR ENHANCED COMPARE AND SEARCH TIMING FOR CAM COMPARE

FIELD OF THE INVENTION

The present invention relates generally to the data processing field, and more particularly, relates to a method and a sum addressed content-addressable memory (CAM) compare including encoder apparatus for implementing a compare function having improved compare and search timing.

DESCRIPTION OF THE RELATED ART

Content-Addressable Memories (CAMs) are commonly used in processors having on-chip cache memory for address translation functions. A CAM is searched by simultaneously comparing a computed effective address with all internally stored effective addresses. If any one of the internally stored effective addresses matches the input address, then the CAM signals that there is a match. The corresponding real address stored together with the matched effective address is read from the CAM for a cache hit verification.

U.S. Pat. No. 6,088,763 issued to Silberman et al. on Jul. 11, 2000 and assigned to the present assignee, discloses a method and apparatus for translating an effective address to a real address within a cache memory. As disclosed, a content-addressable memory contains a multiple of addresses, and each of these addresses is individually associated with a unique tag. The content-addressable memory (CAM) also includes an input circuit, a logic circuit, and an output circuit. The input circuit is for receiving a first number and a second number that are utilized to access the content-addressable memory. The logic circuit is for determining whether or not there is a match between one of the tags and the two numbers, in accordance with a mismatch expression. The output circuit is for generating an address associated with a tag which matches the two numbers, in accordance with the mismatch expression. The subject matter of the above identified patent is incorporated herein by reference.

FIG. 1 illustrates prior art sum addressed content-addressable memory (CAM) compare. The prior art CAM compare include a precharge p-channel field effect transistor (PFET) connected between a positive voltage supply VDD and a dynamic node M4NOR. The prior art CAM compare includes a dynamic compare pulldown circuit connected between the dynamic node M4NOR and an evaluation n-channel field effect transistor (NFET).

In the prior art CAM compare, a gate of the precharge PFET and a gate of the evaluation NFET receive a clock signal at node PRECHARGE. The precharge PFET precharges the dynamic node M4NOR when the clock signal is low and the precharge PFET is turned off when the clock signal is high. The evaluation NFET is turned off when the clock signal is low and is turned on when the clock signal is high.

The dynamic compare pulldown network includes a four high NFET stack including three compare NFETs and the evaluation NFET connected in series between the dynamic node M4NOR and ground potential VSS. Respective true and complement bits from a static storage element (not shown) are applied to the upper two series connected compare pulldown NFETs and respective E00, E01, E10, E11 key input signals are applied to the third compare pulldown NFET. The four high NFET stack in the prior art CAM cells is undesirable and particularly is a problem for high frequency CAM designs.

A need exists for an effective mechanism for implementing the sum addressed compare function that is efficient and enables high frequency operation. It is desirable to provide a sum addressed content-addressable memory (CAM) compare cell that enables reduced latency for a memory access.

SUMMARY OF THE INVENTION

A principal aspect of the present invention is to provide a method and a sum addressed content-addressable memory (CAM) compare for implementing an enhanced sum address compare function. Other important aspects of the present invention are to provide such method and a sum addressed content-addressable memory (CAM) compare substantially without negative effect and that overcome many of the disadvantages of prior art arrangements.

In brief, a method and a sum addressed content-addressable memory (CAM) compare are provided for implementing an enhanced sum address compare function. True and compliment bit signals applied to the CAM compare are encoded by combining respective ones of the applied true and compliment bit signals. Then the encoded true and compliment bit signals are applied to a critical path dynamic compare circuit. An encoder apparatus separated from the critical path encodes true and compliment bit signals that are applied to the critical path dynamic compare circuit.

In accordance with features of the invention, encoder apparatus includes a plurality of two-input NOR gates each respectively receiving two respective ones of the applied bit signals. Each NOR gate provides a NOR output signal that is applied to a dynamic compare pulldown circuit. The critical path dynamic compare circuit is a dynamic compare pulldown circuit coupled between a dynamic node and an evaluation transistor.

In accordance with features of the invention, a set of four NOR output signals is applied to a dynamic compare pulldown circuit. The dynamic compare pulldown circuit includes four compare cells, each compare cell respectively receiving a respective NOR output signal. Each cell includes a pair of series connected transistors including a data transistor and select transistor. The respective NOR output signal is applied to a gate input of the data transistor and a respective E00, E01, E10, E11 key input signal is applied to a gate input of the select transistor.

BRIEF DESCRIPTION OF THE DRAWINGS

The present invention together with the above and other objects and advantages may best be understood from the following detailed description of the preferred embodiments of the invention illustrated in the drawings, wherein.

DETAILED DESCRIPTION OF THE PREFERRED EMBODIMENTS

Figure 2:
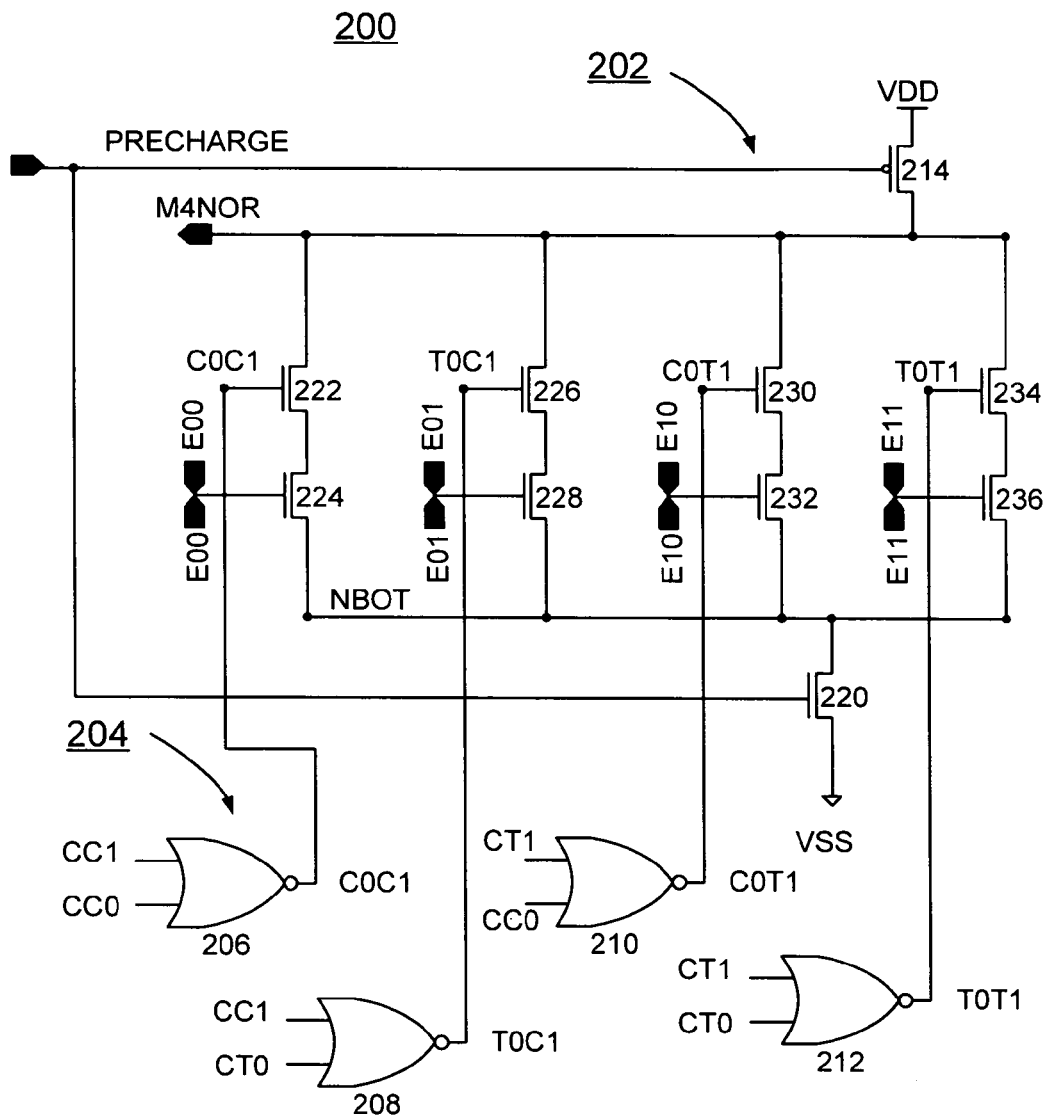
FIG. 2 is a schematic diagram illustrating a sum addressed content-addressable memory (CAM) compare including an encoder apparatus for implementing a sum addressed compare function having improved compare and search timing in accordance with the preferred embodiment.

Having reference now to the drawings, in FIG. 2, there is shown a sum addressed content-addressable memory (CAM) compare in accordance with the preferred embodiment generally designated by the reference character 200. CAM compare 200 includes a dynamic compare pulldown network designated by the reference character 202 and an encoder apparatus generally designated by the reference character 204 for implementing a sum addressed compare function having improved compare and search timing in accordance with the preferred embodiment.

Figure 1:
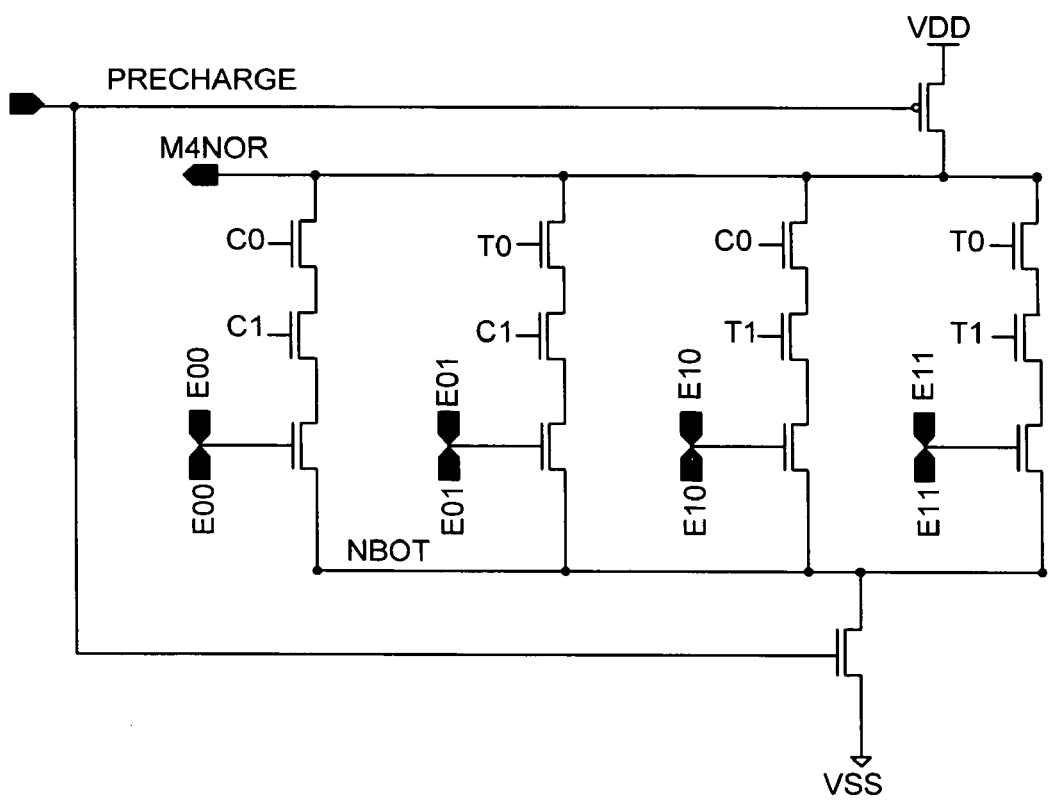
FIG. 1 is a schematic diagram illustrating prior art sum addressed content-addressable memory (CAM) compare cells.

In accordance with features of the preferred embodiment, CAM compare 200 provides an enhanced method for implementing a sum addressed compare function that reduces the complexity of the dynamic compare pulldown network 202, enabling higher frequency operation. Sum addressed compare logic is eliminated from the dynamic compare pulldown network 202 and implemented by the encoder apparatus 204, moving this logic from the critical path to a non-critical path, solving timing problems of the prior art CAM compare as shown in FIG. 1. Encoder apparatus 204 is separated from a critical path including the dynamic compare pulldown network 202.

Encoder apparatus 204 of the CAM compare 200 encodes input true and compliment signals labeled CT0, CC0, CT1, CC1 that are applied to the CAM compare. Encoder apparatus 204 includes a plurality of two-input NOR gates 206, 208, 210, 212. Compliment signals CC1, CC0 are applied to respective inputs of NOR gate 206. True and compliment signals CC1, CT0 are applied to respective inputs of NOR gate 208. True and compliment signals CT1, CC0 are applied to respective inputs of NOR gate 210. True signals CT1, CT0 are applied to respective inputs of NOR gate 212. NOR gates 206, 208, 210, 212 encode the applied signals providing a respective NOR output signal labeled C0C1, T0C1, C0T1, and T0T1.

The NOR output signals C0C1, T0C1, C0T1, T0T1 of NOR gates 206, 208, 210, 212 are applied to the dynamic compare pulldown network 202. The delay required to evaluate the NOR output signals C0C1, T0C1, C0T1, T0T1 of NOR gates 206, 208, 210, 212 in order for a write to complete is removed from the critical compare path.

In accordance with features of the preferred embodiment, the dynamic compare pulldown network 202 of the CAM compare 200 is simplified as compared to the prior art CAM compare as shown in FIG. 1. By using the NOR gates 206, 208, 210, 212 of encoder apparatus 204, an n-channel field effect transistor (NFET) is eliminated from each compare cell of the dynamic compare pulldown network 202 as compared to the prior art CAM compare as shown in FIG. 1. Eliminating this NFET reduces delay in the critical compare path and enables higher frequency operation in the critical path including the dynamic compare pulldown network 202.

In the CAM compare 200, a precharge p-channel field effect transistor (PFET) 214 is connected between a positive voltage supply VDD and a dynamic node M4NOR. The dynamic compare pulldown circuit 202 is connected between the dynamic node M4NOR and an evaluation n-channel field effect transistor (NFET) 220. A gate of the precharge PFET 214 and a gate of the evaluation NFET 220 receive a clock signal at node PRECHARGE. The precharge PFET 214 precharges the dynamic node M4NOR when the clock signal is low and the precharge PFET 214 is turned off when the clock signal is high. The evaluation NFET 220 is turned off when the clock signal is low and is turned on when the clock signal is high.

The dynamic compare pulldown network 202 includes four parallel cells; each cell including a respective series connected pair of data and select NFETs 222, 224; 226, 228; 230, 232; and 234, 236. The dynamic compare pulldown network 202 is connected between the dynamic node M4NOR in series with the evaluation NFET 220 connected to ground potential VSS. Respective NOR output signals C0C1, T0C1, C0T1, T0T1 of NOR gates 206, 208, 210, 212 are applied to the upper data NFETs 222, 226, 230, 234 and respective E00, E01, E10, E11 key input signals are applied to the second select NFET 224, 228, 232, 236. The three high NFET stack of dynamic compare pulldown network 202 overcomes limitations of the four high NFET stack in the prior art CAM cells of FIG. 1, enabling enhanced high frequency CAM compare function.

While the present invention has been described with reference to the details of the embodiments of the invention shown in the drawing, these details are not intended to limit the scope of the invention as claimed in the appended claims.

What is claimed is:

1. A sum addressed content-addressable memory (CAM) compare for implementing an enhanced sum address compare function comprising:

an encoder apparatus for encoding applied true and compliment bit signals to provide encoded bit signals;

a dynamic compare pulldown circuit coupled to said encoder apparatus; and said dynamic compare pulldown circuit coupled between a dynamic node and an evaluation transistor; said dynamic compare pulldown circuit including a plurality of compare transistors, each compare transistor having a gate input receiving a respective one of said encoded bit signals.

2. A sum addressed content-addressable memory (CAM) compare as recited in claim 1 wherein said encoder apparatus is separate from a critical path including said dynamic compare pulldown circuit.

3. A sum addressed content-addressable memory (CAM) compare as recited in claim 1 wherein said encoder apparatus includes a plurality of two-input NOR gates, each respectively receiving two respective ones of the applied bit signals.

4. A sum addressed content-addressable memory (CAM) compare as recited in claim 1 wherein said encoder apparatus includes a four two-input NOR gates, each respectively receiving two respective ones of the applied bit signals.

5. A sum addressed content-addressable memory (CAM) compare as recited in claim 4 wherein said dynamic compare pulldown circuit includes four compare transistors, each having a gate input receiving a respective encoded NOR output signal.

6. A sum addressed content-addressable memory (CAM) compare as recited in claim 1 includes a precharge transistor for precharging said dynamic node prior to a clock signal transition; said evaluation transistor being enabled after the clock signal transition.

7. A method for implementing an enhanced sum address compare function as recited in claim 6 wherein each said compare transistor having a gate input receiving a respective one of said encoded bit signals when said evaluation transistor is enabled.

8. A sum addressed content-addressable memory (CAM) compare as recited in claim 1 wherein said dynamic compare pulldown circuit includes a second transistor connected in series with said compare transistor; and wherein said compare transistor and said second transistor are connected between said dynamic node and said evaluation transistor.

9. A sum addressed content-addressable memory (CAM) compare as recited in claim 8 wherein each said second transistor has a gate input receiving a respective E00, E01, E10, E11 key input signal.

10. A sum addressed content-addressable memory (CAM) compare as recited in claim 1 wherein said evaluation transistor is an n-channel field effect transistor (NFET); said evaluation NFET connected between said dynamic compare pulldown circuit and a ground connection.

11. A sum addressed content-addressable memory (CAM) compare as recited in claim 10 includes a precharge transistor for precharging said dynamic node; said precharge transistor is a P-channel field effect transistor (PFET) connected between said dynamic node and a voltage supply.

12. A sum addressed content-addressable memory (CAM) compare as recited in claim 11 wherein a common clock signal is applied to a gate input of both said precharge PFET and said evaluation NFET.

13. A method for implementing an enhanced sum address compare function using a sum addressed content-addressable memory (CAM) compare, said method comprising the steps of:
    encoding true and compliment bit signals applied to the CAM compare by combining respective ones of the applied true and compliment bit signals;
    applying the encoded true and compliment bit signals to a critical path dynamic compare circuit.

14. A method for implementing an enhanced sum address compare function as recited in claim 13 wherein the encoding step is performed by encoder apparatus; and wherein the encoder apparatus is separated from the critical path of said critical path dynamic compare circuit.

15. A method for implementing an enhanced sum address compare function as recited in claim 13 wherein the encoding step includes the steps of: providing four two-input NOR gates, each said NOR gate respectively receiving two respective ones of the applied bit signals and providing an encoded NOR output signal.

16. A method for implementing an enhanced sum address compare function as recited in claim 15 wherein the applying step includes the steps of: providing four compare transistors in said critical path dynamic compare circuit; and applying a respective encoded NOR output signal to a gate input of each of said four compare transistors.

* * * * *